(12) United States Patent
Zhang

(10) Patent No.: US 9,660,054 B2
(45) Date of Patent: May 23, 2017

(54) TUNNELING FIELD EFFECT TRANSISTOR (TFET) WITH ULTRA SHALLOW POCKETS FORMED BY ASYMMETRIC ION IMPLANTATION AND METHOD OF MAKING SAME

(71) Applicant: Taiwan Semiconductor Manufacturing Company, Ltd., Hsin-Chu (TW)

(72) Inventor: Ying Zhang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/997,896

(22) Filed: Jan. 18, 2016

(65) Prior Publication Data

US 2016/0133723 A1 May 12, 2016

Related U.S. Application Data

(62) Division of application No. 13/712,736, filed on Dec. 12, 2012, now Pat. No. 9,252,250.

(51) Int. Cl.
*H01L 29/66* (2006.01)
*H01L 29/73* (2006.01)
*H01L 29/739* (2006.01)
*H01L 29/10* (2006.01)
*H01L 21/265* (2006.01)

(52) U.S. Cl.
CPC .. *H01L 29/66659* (2013.01); *H01L 21/26513* (2013.01); *H01L 29/1045* (2013.01); *H01L 29/66356* (2013.01); *H01L 29/7311* (2013.01); *H01L 29/7391* (2013.01)

(58) Field of Classification Search
None
See application file for complete search history.

(56) References Cited

U.S. PATENT DOCUMENTS

| | | |
|---|---|---|
| 6,133,079 A | 10/2000 | Zhu et al. |
| 6,902,971 B2 | 6/2005 | Grudowski |
| 7,646,039 B2 | 1/2010 | Zhu et al. |
| 8,384,122 B1 | 2/2013 | Hu et al. |
| 8,592,911 B2 | 11/2013 | Liang et al. |
| 2002/0072180 A1 | 6/2002 | Yugami et al. |

(Continued)

OTHER PUBLICATIONS

Patel, P. et al., "A Low Voltage Steep Turn-Off Tunnel Transistor Design," International Conference on Simulation of Semiconductor Processes and Devices ("SISPAD"), 2009, pp. 23-26.

(Continued)

*Primary Examiner* — Angel Roman
*Assistant Examiner* — Kevin Quinto
(74) *Attorney, Agent, or Firm* — Slater Matsil, LLP

(57) ABSTRACT

An embodiment integrated circuit device and a method of making the same. The embodiment integrated circuit includes a substrate supporting a source with a first doping type and a drain with a second doping type on opposing sides of a channel region in the substrate, and a pocket disposed in the channel region, the pocket having the second doping type and spaced apart from the drain between about 2 nm and about 15 nm. In an embodiment, the pocket has a depth of between about 1 nanometer to about 30 nanometers.

20 Claims, 6 Drawing Sheets

(56) References Cited

U.S. PATENT DOCUMENTS

| | | |
|---|---|---|
| 2003/0224617 A1 | 12/2003 | Baek et al. |
| 2005/0275010 A1 | 12/2005 | Chen et al. |
| 2006/0189080 A1 | 8/2006 | Lee et al. |
| 2007/0045753 A1 | 3/2007 | Pae et al. |
| 2009/0152650 A1 | 6/2009 | Chudzik et al. |
| 2010/0038713 A1* | 2/2010 | Majhi ................ H01L 21/2652 257/344 |
| 2012/0228706 A1 | 9/2012 | Sugizaki et al. |

OTHER PUBLICATIONS

Sterkel, M., et al., "Complementary Tunneling-Transistors (TFET): Fabrication and Application down to the 65 nm CMOS-node," SINANO Workshop: Nanoscale CMOS and emerging post-CMOS logic and memory nanodevices, Sep. 16, 2005, 27 pages.
U.S. Appl. No. 13/712,736, filed Dec. 12, 2012.
U.S. Appl. No. 13/718,992, filed Dec. 18, 2012.
U.S. Appl. No. 14/656,847, filed Mar. 13, 2015.

* cited by examiner

US 9,660,054 B2

TUNNELING FIELD EFFECT TRANSISTOR (TFET) WITH ULTRA SHALLOW POCKETS FORMED BY ASYMMETRIC ION IMPLANTATION AND METHOD OF MAKING SAME

PRIORITY CLAIM AND CROSS-REFERENCE

This application is a divisional of U.S. application Ser. No. 13/712,736, filed on Dec. 12, 2012, entitled "Tunneling Field Effect Transistor (TFET) With Ultra Shallow Pockets Formed By Asymmetric Ion Implantation and Method of Making Same," which application is incorporated by reference herein in its entirety.

BACKGROUND

Advances in the semiconductor industry have reduced the size of transistors in integrated circuits (ICs) to 32 nanometers and smaller. The decrease in transistor sizes leads to decreases in power supply voltage to the transistors. As the power supply voltage has decreased, the threshold voltage of the transistors in the ICs has also decreased.

Lower threshold voltages are difficult to obtain in a conventional metal-oxide-semiconductor field-effect transistor (MOSFET). Indeed, as the threshold voltage is reduced the ratio of on current to off current ($I_{on}/I_{off}$) also decreases. The on current refers to the current through the MOSFET when an applied gate voltage is above the threshold voltage, and the off current refers to current through the MOSFET when the applied gate voltage is below the threshold voltage.

The on current to off current ratio may be improved by using a tunneling field-effect transistor (TFET). The TFET takes advantage of band-to-band tunneling (BTBT) to increase the achievable on current ($I_{on}$), which permits further reductions in threshold voltage, power supply voltage, and transistor size. Unfortunately, forming the dopant pocket in the TFET is challenging.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to embodiments in a specific context, namely a tunneling field effect transistor (TFET). The concept may also be applied, however, to other integrated circuits (e.g., a fin field effect transistor (FinFET), a planar metal-oxide-semiconductor field-effect transistor (MOSFET), a double-gate MOSFET, a tri-gate MOSFET, etc.) and electronic structures.

Figure 1:
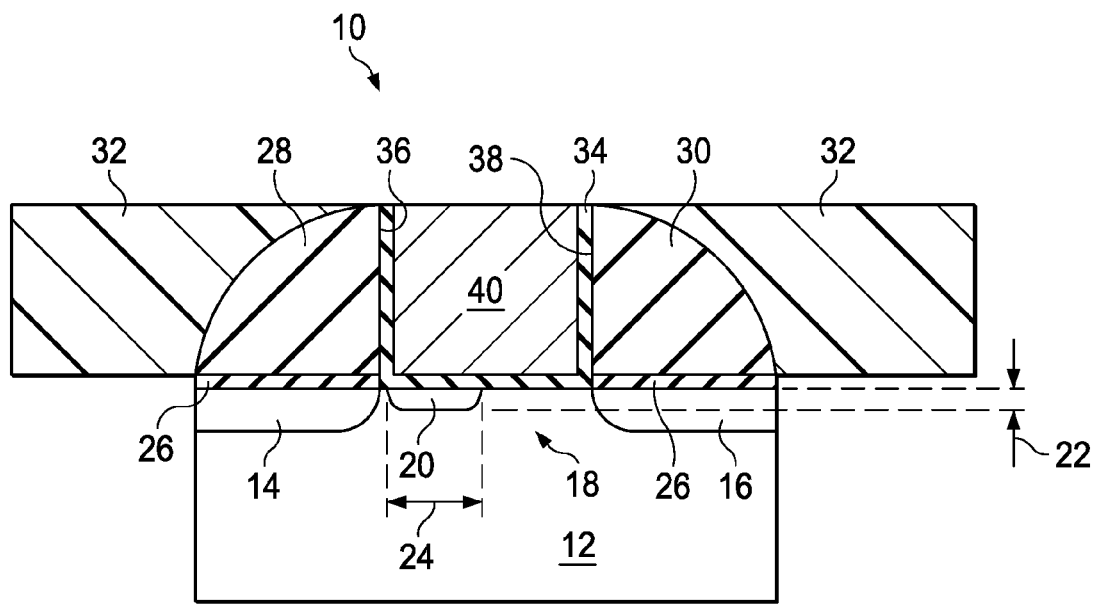
FIG. 1 is a cross section of an embodiment TFET having an ultra-shallow pocket formed in a channel region.

Referring now to FIG. 1, an embodiment TFET 10 is illustrated. As shown, the TFET 10 includes a substrate 12 supporting a source 14 with a first doping type (e.g., p-type) and a drain 16 with a second doping type (e.g., n-type) on opposing sides of a channel region 18 in the substrate 12. In an embodiment, the substrate 12 is formed from silicon, a silicon-containing material, an intrinsic silicon, and so on.

Still referring to FIG. 1, the TFET 10 also includes an ultra-shallow pocket 20 disposed in the channel region 18. As shown, the ultra-shallow pocket 20 has the second doping type (e.g., n-type) and is disposed closer to the source 14 than the drain 16. In an embodiment, the ultra-shallow pocket 20 is spaced apart from the drain 16 between about 2 nanometers and about 15 nanometers. In an embodiment, the channel region 18 containing the ultra-shallow pocket 20 is disposed in a fin of a FinFET device as opposed to the TFET 10 of FIG. 1. In other words, the ultra-shallow pocket 20 disclosed herein may be included in other types of integrated circuits.

The ultra-shallow pocket 20 permits band-to-band tunneling (BTBT) to occur within the TFET 10. In an embodiment, a first tunneling path exists between the source 14 and the ultra-shallow pocket 20 while a second tunneling path exists between the source 14 and the channel region 18.

In an embodiment, the ultra-shallow pocket 20 has a depth 22 of between about 1 nanometer (nm) and about 30 nm. In an embodiment, the ultra-shallow pocket 20 has a width 24 of between about 1 nm and about 15 nm. It should be recognized that such dimensions are dependent on design parameters of the TFET 10 and are not intended to be limiting. In other words, other dimensions are considered to be within the scope of the disclosure.

Still referring to FIG. 1, the TFET 10 includes a gate dielectric 26 (e.g., a gate oxide) disposed over the source 14 and the drain 16. The TEFT 10 also includes a first spacer 28 disposed over the source 14 and a second spacer 30 disposed over the drain 16. In an embodiment, the first spacer 28 and the second spacer 30 are each formed from silicon nitride or a silicon/nitrogen-containing compound (e.g., SiNx). As shown, a spin on resist layer 32 may abut the first spacer 28 and the second spacer 30 in the intermediate stage of manufacture illustrated in FIG. 1.

Still referring to FIG. 1, the TFET 10 further includes a high-k dielectric layer 34 (e.g., a high-k oxide). As used herein, the term high-k dielectric layer 34 refers to a dielectric having a dielectric constant, k, higher than the dielectric constant of silicon dioxide. As shown, the high-k dielectric layer 34 is disposed over a first sidewall 36 of the first spacer 28, over the ultra-shallow pocket 20, over the adjacent channel region 18, and over a second sidewall 38 of the second spacer 30. In an embodiment, the high-k dielectric layer 34 is formed from hafnium silicate, zirconium silicate, hafnium dioxide, and so on. In addition to the high-k dielectric layer 34, a metal gate stack 40 is disposed over the channel region 18. The high-k dielectric layer 34 and the metal gate stack 40 are generally disposed between the first spacer 28 and the second spacer 30.

Figure 2A:
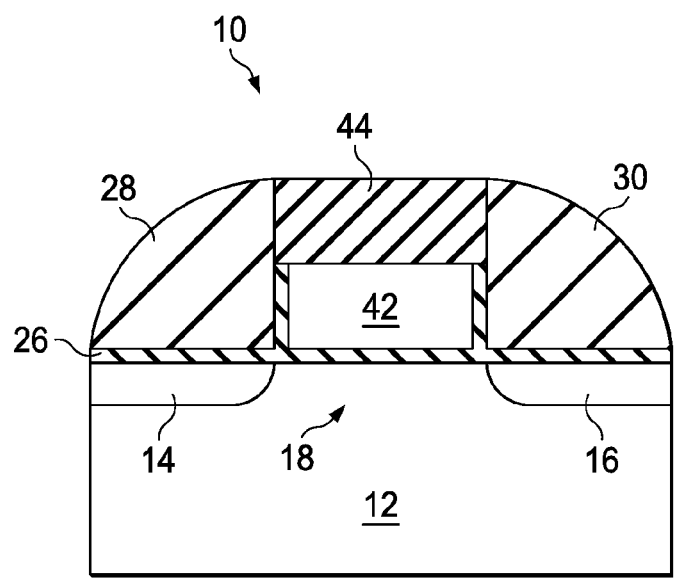
FIGS. 2a-2j collectively illustrate a method of forming the embodiment TFET of FIG. 1.

Referring now to FIGS. 2a-2j, an embodiment method of forming the TFET 10 of FIG. 1 is collectively illustrated. As shown in FIG. 2a, the method begins by forming the source 14 with the first doping type and the drain 16 with the second doping type in the substrate 12 on opposing sides of the channel region 18. Thereafter, the gate dielectric 26 is formed over the source 14, the channel region 18, and the drain 16. In addition, the first spacer 28 and the second spacer 30 are formed over the source 14 and the drain 16.

In an embodiment, the first spacer 28 and the second spacer 30 are formed using a low pressure chemical vapor deposition (LPCVD) technology, which works at rather high temperature and is done either in a vertical or in a horizontal tube furnace, or a plasma-enhanced chemical vapor deposition (PECVD) technology, which works at rather low temperature and vacuum conditions.

Still referring to FIG. 2a, a dummy gate 42 and a hard mask 44 are formed over the gate dielectric 26 between the first spacer 28 and the second spacer 30. In an embodiment, the dummy gate 42 is formed from a polysilicon. In an embodiment, the hard mask 44 is formed from an oxide, silicon dioxide, silicon nitride, or other suitable materials.

Figure 2B:
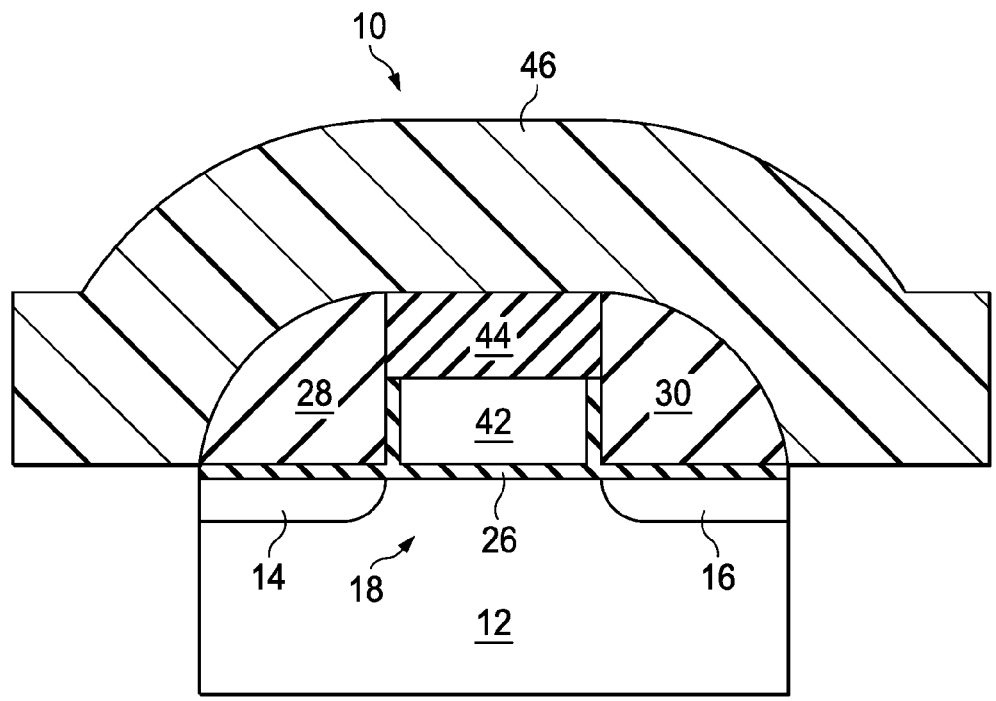
Figure 2C:
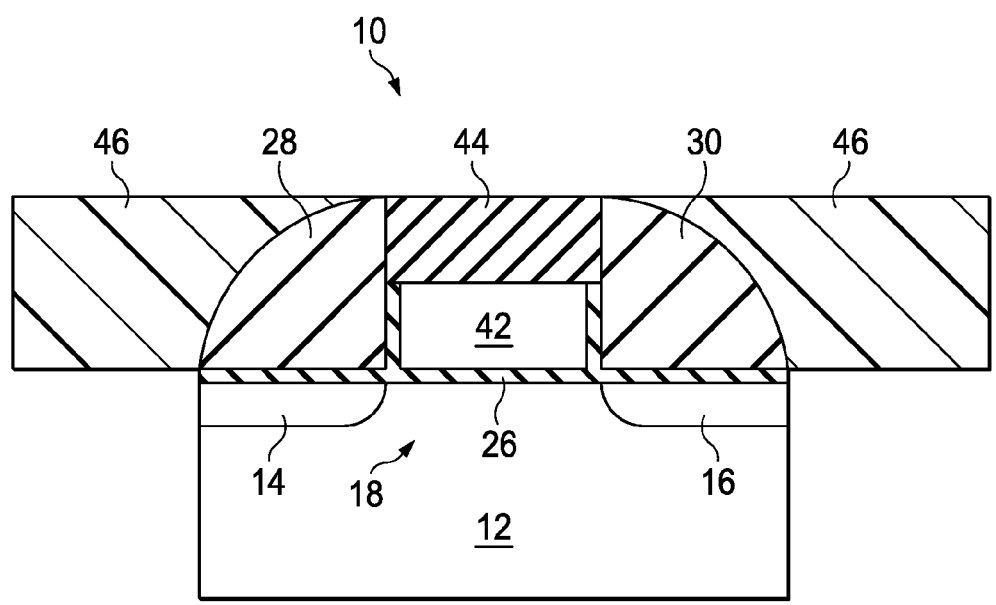

Referring now to FIG. 2b, a resist layer 46 is formed over the first spacer 28, the hard mask 44, and the second spacer 30. In an embodiment, the resist layer 46 is deposited using a spin-on process. Moving on to FIG. 2c, the resist layer 46 is recessed down to the hard mask 44. The resist layer 46 may be recessed using, for example, a wet etching process or a dry etching process.

Figure 2D:
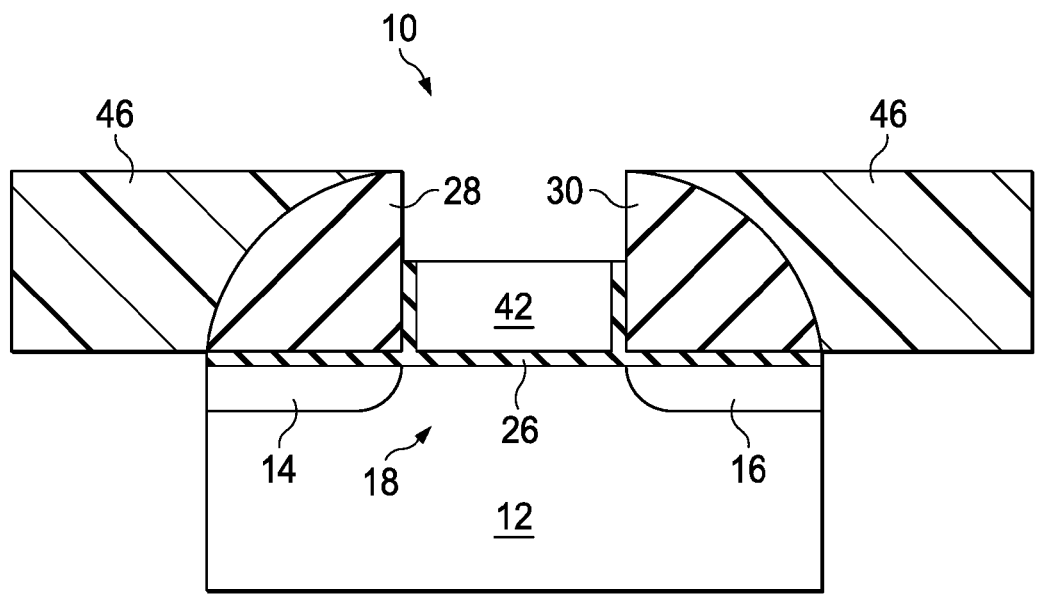
Figure 2E:
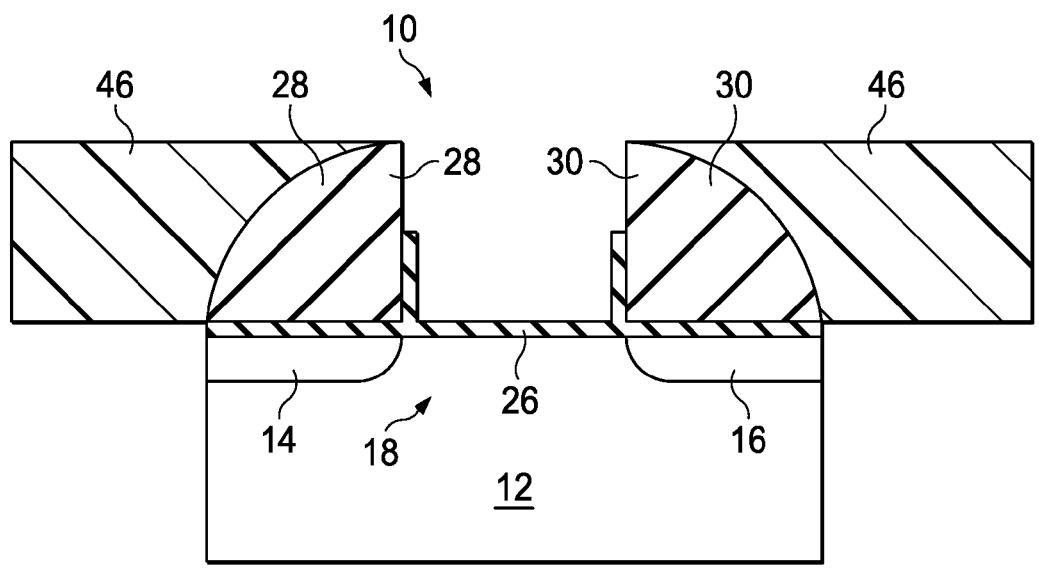

Referring now to FIG. 2d, the hard mask 44 is removed down to the dummy gate 42. In an embodiment, the hard mask 44 is removed using a dry plasma etching process, a chemical down-stream etching (CDE), or a combination thereof. Referring now to FIG. 2e, the dummy gate 42 is removed down to the gate dielectric 26. In an embodiment, the dummy gate 42 is removed using a dry plasma etching process, a chemical down-stream etching (CDE), or a combination thereof.

Figure 2F:
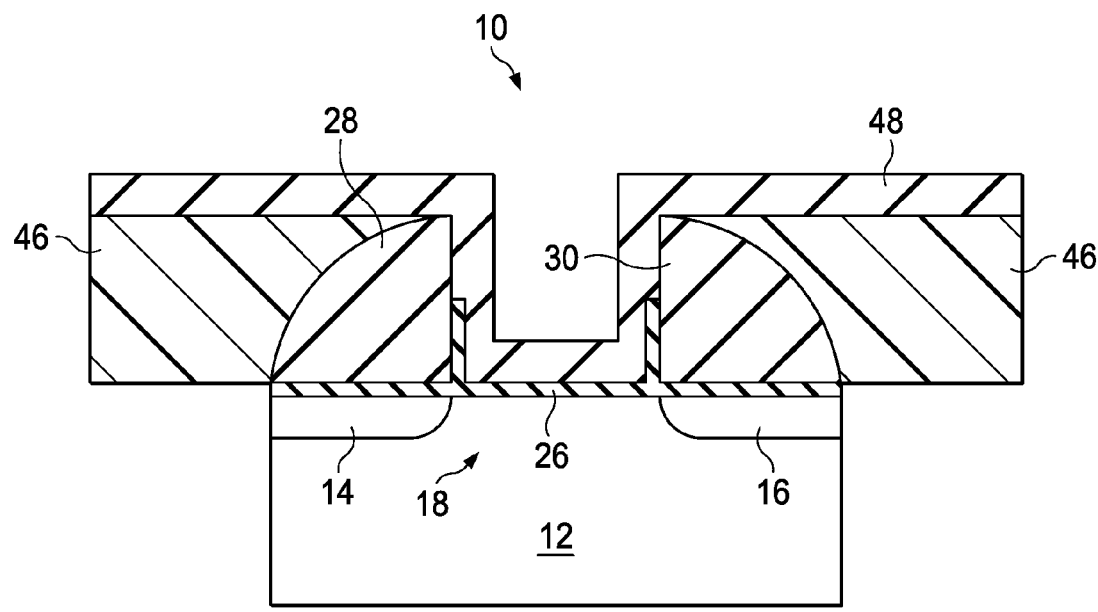
Figure 2G:
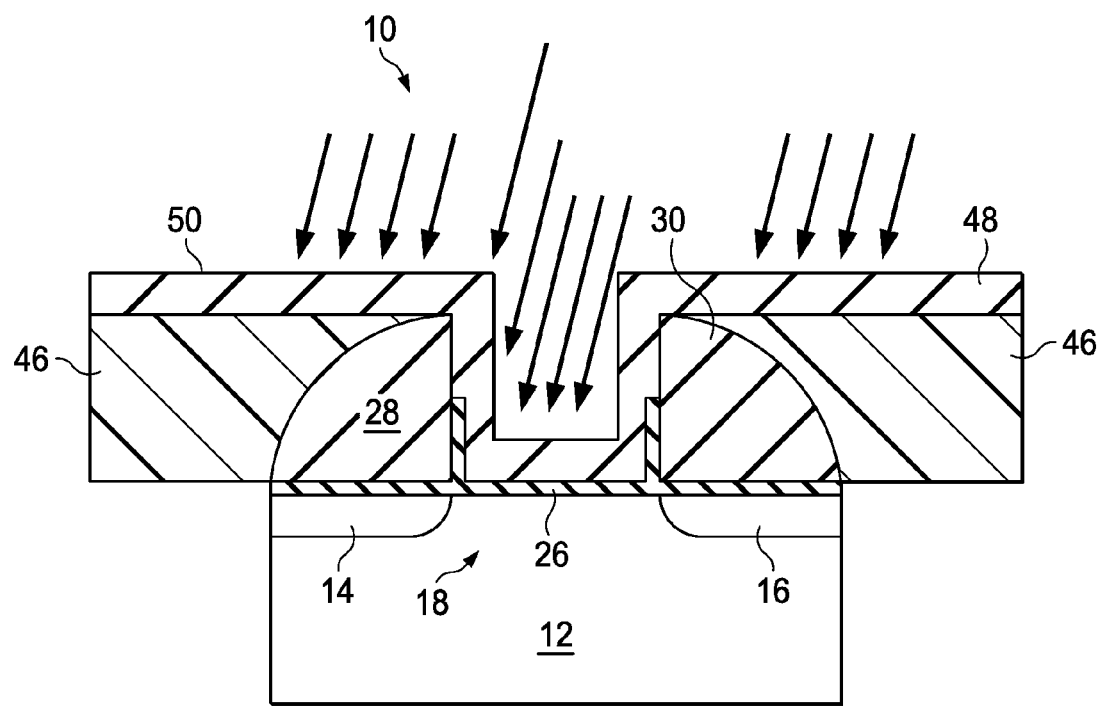

Referring now to FIG. 2f, a nitride layer 48 is formed over the resist layer 46, the first spacer 28, the gate dielectric 26, and the second spacer 30. In an embodiment, the nitride layer 48 is a low-temperature nitride film. Moving now to FIG. 2g, germanium ions (Ge+) are implanted in the nitride layer 48 (as indicated by the arrows). As shown, in an embodiment the germanium ions are implanted in a direction that forms an acute angle with a top surface 50 of the nitride layer 48.

Figure 2H:
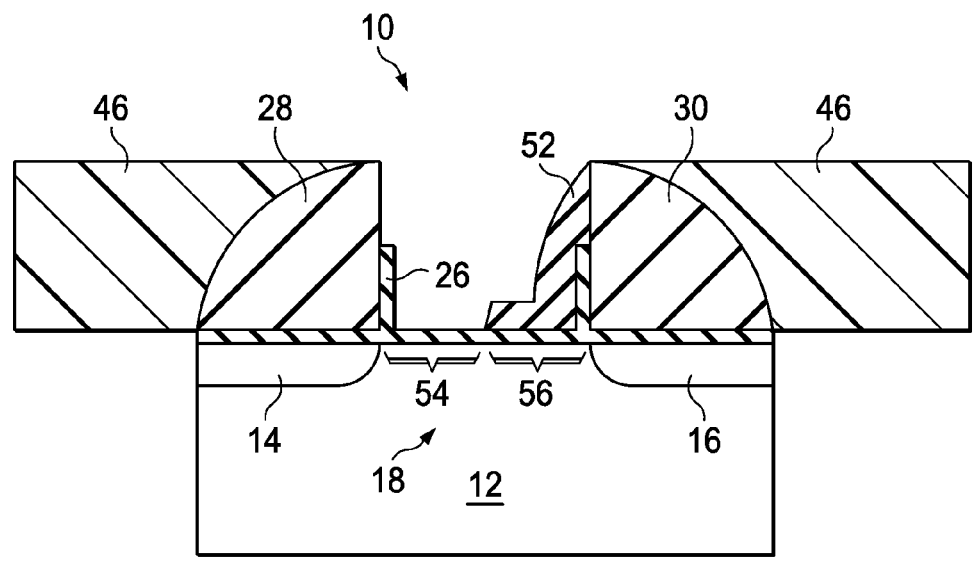

Referring now to FIG. 2h, the germanium-implanted portions of the nitride layer 48 (FIG. 2g) are removed to form the asymmetric low temperature nitride spacer 52. In an embodiment, the germanium-implanted portions of the nitride layer 48 are removed by a plasma etching process. In an embodiment, the germanium-implanted portions of the nitride layer 48 are selectively removed using fluoride (F), carbon (C), and/or hydrogen (H) containing plasmas such as, for example, mixtures of $CF_4/CHF_3$, $CH_2F_2$, $CH_3F$, Argon (Ar), and so on. The selectivity of ion implanted nitride film versus deposited nitride film may be 3:1 or higher due to the reactivity of F-bonding with more dangling bonds of $SiN_x$, i.e., amorphized nitride film. As shown in FIG. 2h, the asymmetric low temperature nitride spacer 52 leaves a first portion 54 of the channel region 18 generally unprotected or uncovered and protects or covers a second portion 56 of the channel region 18.

Figure 2I:
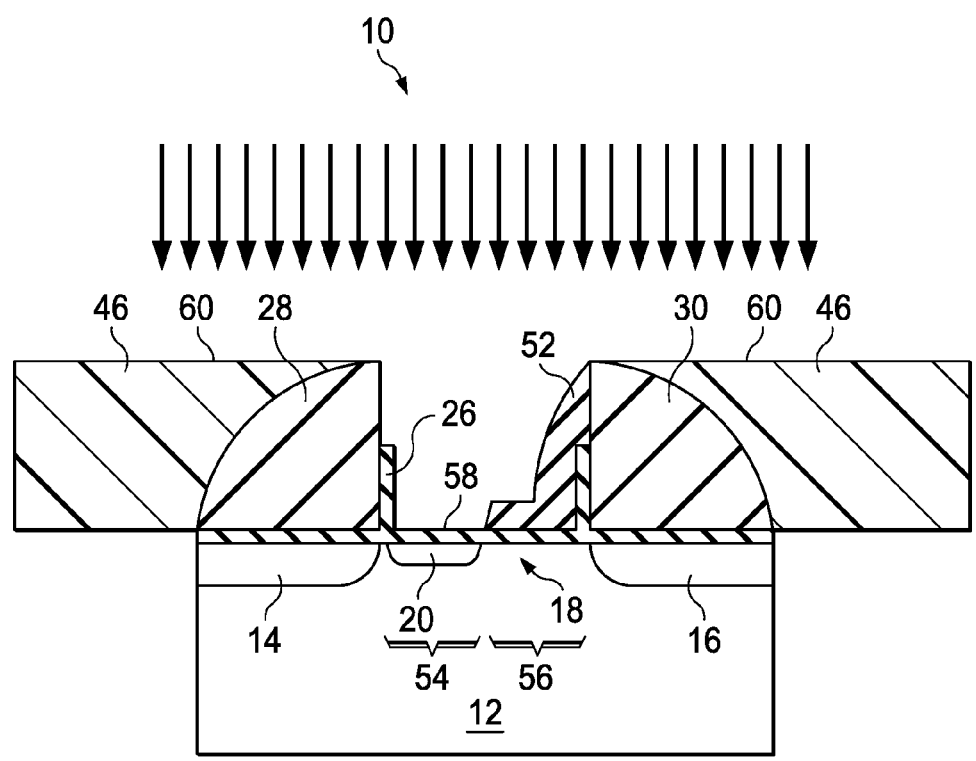

Referring now to FIG. 2i, n-type impurities (as indicated by the arrows) are implanted in the first portion 54 of the channel region 18. As shown in FIG. 2i, the n-type ion implantation process produces the ultra-shallow pocket 20 in the first portion 54 of the channel region 18, which was left unprotected by the asymmetric low temperature nitride spacer 52. The n-type impurities may be, for example, phosphorus, arsenic, antimony, or another suitable impurity. Unlike the implantation of germanium ions in FIG. 2g, the n-type impurities are implanted in a direction generally perpendicular to a top surface 58 of the gate dielectric 26 and/or a top surface 60 of the resist layer 46.

Figure 2J:
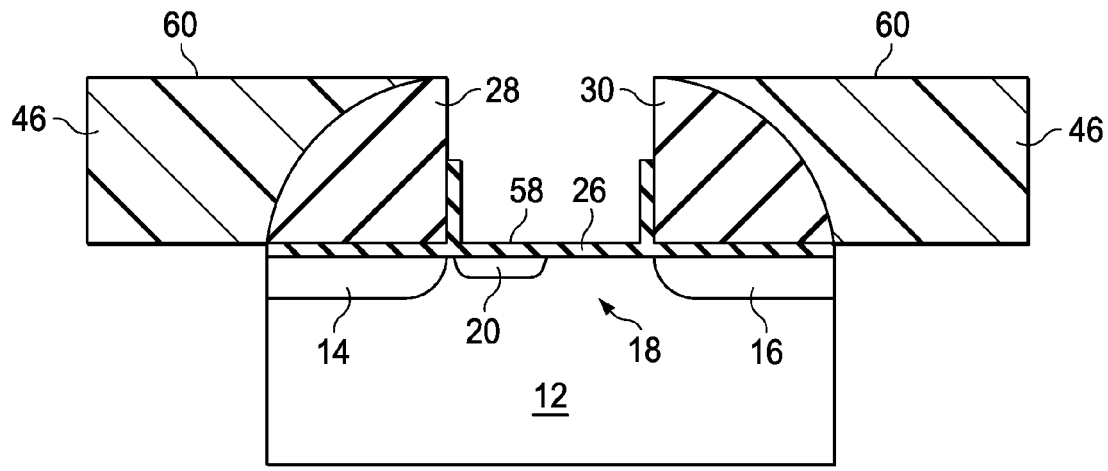

Referring now to FIG. 2j, the asymmetric low temperature nitride spacer 52, the remaining portions of the hard mask 44, and the gate dielectric 26 disposed over the channel region 18 are removed. In an embodiment, the remaining portions of the hard mask 44 and the gate dielectric 26 are removed using wet etching (e.g., diluted hydrofluoric acid (dHF) etching, etc.), chemical downstream etching (CDE), or dry etching (e.g., chemical oxide removal (COD), etc.). In an embodiment, the asymmetric low temperature nitride spacer 52 is removed using a plasma etching process. Thereafter, as shown in FIG. 1, the gate dielectric 26 is removed over the channel region 18. Next, the high-k dielectric layer 34 and the metal gate stack 40 are formed over the ultra-shallow pocket 20 and the second portion 56 of the channel region 18 and between the first spacer 28 and the second spacer 30 to form the TFET 10. In an embodiment, the high-k dielectric layer 34 is formed using an atomic level deposition (ALD) process.

Figure 3:
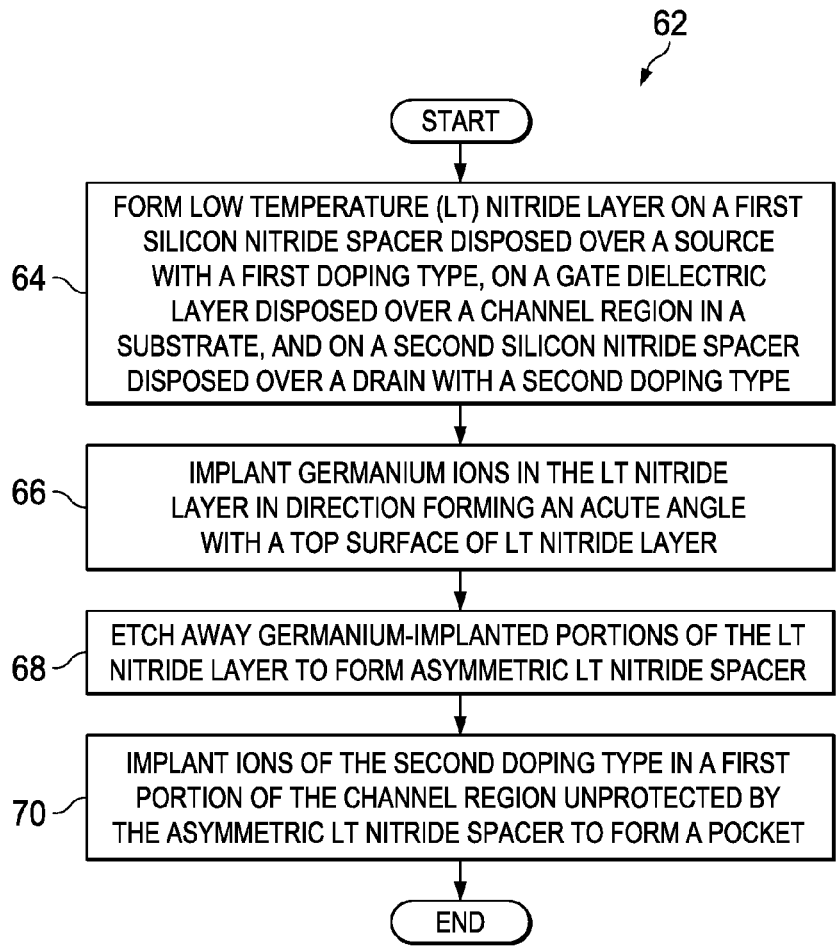
FIG. 3 illustrates an embodiment method of forming the TFET of FIG. 1.

Referring now to FIG. 3, an embodiment method 62 of forming an integrated circuit (e.g., the TFET 10 of FIG. 1) is provided. In block 64, a low temperature nitride layer is formed on a first silicon nitride spacer disposed over a source with a first doping type, on a gate dielectric layer disposed over a channel region in a substrate, and on a second silicon nitride spacer disposed over a drain with a second doping type. In block 66, germanium ions are implanted in the low temperature nitride layer in a direction forming an acute angle with a top surface of the low temperature nitride layer. In block 68, germanium-implanted portions of the low temperature nitride layer are etched away to form an asymmetric low temperature nitride spacer. In block 70, ions of the second doping type are implanted in a first portion of the channel region unprotected by the asymmetric low temperature nitride spacer to form a pocket.

The TFET 10 of FIG. 1 has several advantages relative to a conventional TFET. For example, the ultra-shallow pocket 20 of the TFET 10 is has a depth of between about 1 nm to about 30 nm. Due to the ultra-shallow pocket 20, the TFET 10 is able to operate below 0.5 Volts while maintaining a relatively large on current/off current ratio for this voltage. In addition, the ultra-shallow pocket 20 is self-aligning due to, for example, the process collectively illustrated in FIGS. 2a-2j. In addition, the TFET 10 having the ultra-shallow pocket 20 may be formed using a commercially-feasible manufacturing process.

An embodiment integrated circuit includes a substrate supporting a source with a first doping type and a drain with a second doping type on opposing sides of a channel region in the substrate, and a pocket disposed in the channel region, the pocket having the second doping type and spaced apart from the drain between about 2 nm and about 15 nm.

An embodiment integrated circuit includes a substrate supporting a source with a first doping type and a drain with a second doping type on opposing sides of a channel region in the substrate, a pocket disposed in the channel region, the pocket having the second doping type and a depth of between about 1 nm and about 30 nm, and a metal gate stack disposed over the channel region.

An embodiment method of forming an integrated circuit includes forming a low temperature nitride layer on a first silicon nitride spacer disposed over a source with a first doping type, on a gate dielectric layer disposed over a channel region in a substrate, and on a second silicon nitride spacer disposed over a drain with a second doping type, implanting germanium ions in the low temperature nitride layer in a direction forming an acute angle with a top surface of the low temperature nitride layer, etching away germanium-implanted portions of the low temperature nitride layer to form an asymmetric low temperature nitride spacer, and implanting ions of the second doping type in a first portion of the channel region unprotected by the asymmetric low temperature nitride spacer to form a pocket.

In accordance with an embodiment, a method includes forming a dummy gate stack over a channel region in a substrate. A first silicon nitride spacer is formed over a source region in the substrate, the source region having a first doping type, the first silicon nitride spacer extending along a first sidewall of the dummy gate stack. A second silicon nitride spacer is formed over a drain region in the substrate, the drain region having a second doping type, the second silicon nitride spacer extending along a second sidewall of the dummy gate stack, the second sidewall of the dummy gate stack being opposite of the first sidewall of the dummy gate stack. The dummy gate stack is removed. A low temperature nitride layer is formed over the first silicon nitride spacer, the second silicon nitride spacer and the channel region. Germanium ions are implanted in the low temperature nitride layer in a direction forming an acute angle with a top surface of the low temperature nitride layer. Germanium-implanted portions of the low temperature nitride layer are removed to form an asymmetric low temperature nitride spacer over a first portion of the channel region. Ions of the second doping type are implanted in a second portion of the channel region unprotected by the asymmetric low temperature nitride spacer to form a pocket.

In accordance with another embodiment, a method includes forming a dummy gate stack over a channel region in a substrate, the dummy gate stack comprising a dummy gate dielectric layer. A first source/drain region and a second source/drain region are formed in the substrate, the first source/drain region having a first doping type and the second source/drain region having a second doping type, the dummy gate stack being interposed between the first source/drain region and the second source/drain region. A first spacer is formed over the first source/drain region. A second spacer is formed over the second source/drain region. The dummy gate dielectric layer is exposed over the channel region. A third spacer is formed over the dummy gate dielectric layer, the third spacer partially covering the dummy gate dielectric layer. A pocket of the second doping type is formed in the channel region, the pocket being disposed below a portion of the dummy gate dielectric layer unprotected by the third spacer, the pocket being interposed between the first source/drain region and the second source/drain region.

In accordance with yet another embodiment, a method includes forming a first spacer over a first source/drain region in a substrate, the first source/drain region having a first conductivity type. A second spacer is formed over a second source/drain region in the substrate, the second source/drain region having a second conductivity type, the second conductivity type being different from the first conductivity type. A first mask layer is deposited over a channel region in the substrate, the first spacer and the second spacer. An etch rate of an altered portion of the first mask layer is altered. A selective etching process is performed on the first mask layer to remove the altered portion of the first mask layer, wherein an unremoved portion of the first mask layer forms a third spacer. A first ion implantation process is performed on a portion of the channel region unprotected by the third spacer to form a pocket, the pocket having the first conductivity type.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method comprising:
    forming a dummy gate stack over a channel region in a substrate;
    forming a first silicon nitride spacer over a source region in the substrate, the source region having a first doping type, the first silicon nitride spacer extending along a first sidewall of the dummy gate stack;
    forming a second silicon nitride spacer over a drain region in the substrate, the drain region having a second doping type, the second silicon nitride spacer extending along a second sidewall of the dummy gate stack, the second sidewall of the dummy gate stack being opposite of the first sidewall of the dummy gate stack;
    removing the dummy gate stack;
    forming a low temperature nitride layer over the first silicon nitride spacer, the second silicon nitride spacer and the channel region;
    implanting germanium ions in the low temperature nitride layer in a direction forming an acute angle with a top surface of the low temperature nitride layer;
    removing germanium-implanted portions of the low temperature nitride layer to form an asymmetric low temperature nitride spacer over a first portion of the channel region; and
    implanting ions of the second doping type in a second portion of the channel region unprotected by the asymmetric low temperature nitride spacer to form a pocket.

2. The method of claim 1, further comprising forming the pocket with a depth of between about 1 nm to about 30 nm.

3. The method of claim 1, further comprising forming the pocket a distance of between about 2 nm to about 15 nm away from the drain region.

4. The method of claim 1, further comprising removing the asymmetric low temperature nitride spacer over the second portion of the channel region.

5. The method of claim 4, further comprising forming a high-k dielectric layer and a metal layer over the pocket and the first portion of the channel region.

6. The method of claim 1, wherein the second silicon nitride spacer protects at least a portion of the low temperature nitride layer from the germanium ions.

7. A method comprising:
    forming a dummy gate stack over a channel region in a substrate, the dummy gate stack comprising a dummy gate dielectric layer;
    forming a first source/drain region and a second source/drain region in the substrate, the first source/drain region having a first doping type and the second source/drain region having a second doping type, the dummy gate stack being interposed between the first source/drain region and the second source/drain region;
    forming a first spacer over the first source/drain region;
    forming a second spacer over the second source/drain region;

exposing the dummy gate dielectric layer over the channel region;

forming a third spacer over the dummy gate dielectric layer, the third spacer partially covering the dummy gate dielectric layer, wherein a width of the third spacer decreases as the third spacer extends along a sidewall of the second spacer away from the dummy gate dielectric layer; and forming a pocket of the second doping type in the channel region, the pocket being disposed below a portion of the dummy gate dielectric layer unprotected by the third spacer, the pocket being interposed between the first source/drain region and the second source/drain region.

8. The method of claim 7, wherein forming the pocket comprises implanting ions of the second doping type in a portion of the channel region below the portion of the dummy gate dielectric layer unprotected by the third spacer in a direction perpendicular to a top surface of the dummy gate dielectric layer.

9. The method of claim 7, further comprising:
removing the third spacer;
removing the dummy gate dielectric layer to expose the channel region; and
forming an active gate stack over the channel region.

10. The method of claim 7, wherein the third spacer physically contacts the second spacer.

11. The method of claim 7, wherein forming the third spacer comprises:
depositing a nitride layer on the dummy gate dielectric layer, on a sidewall of the first spacer, and on a sidewall of the second spacer;
implanting germanium ions in the nitride layer in a direction forming an acute angle with a top surface of the nitride layer to form a germanium-implanted portion of the nitride layer; and
removing the germanium-implanted portion of the nitride layer, wherein an unremoved portion of the nitride layer forms the third spacer.

12. The method of claim 11, wherein removing the germanium-implanted portion of the nitride layer comprises selectively etching the germanium-implanted portion of the nitride layer.

13. The method of claim 12, wherein an etch selectivity of the germanium-implanted portion of the nitride layer versus an unimplanted portion of the nitride layer is higher than about 3:1.

14. A method comprising:
forming a first spacer over a first source/drain region in a substrate, the first source/drain region having a first conductivity type;
forming a second spacer over a second source/drain region in the substrate, the second source/drain region having a second conductivity type, the second conductivity type being different from the first conductivity type;
depositing a first mask layer over a channel region in the substrate, the first spacer and the second spacer;
altering an etch rate of an altered portion of the first mask layer;
performing a selective etching process on the first mask layer to remove the altered portion of the first mask layer, wherein an unremoved portion of the first mask layer forms a third spacer; and
performing a first ion implantation process on a portion of the channel region unprotected by the third spacer to form a pocket, the pocket having the first conductivity type.

15. The method of claim 14, wherein altering the etch rate of the altered portion of the first mask layer comprises performing a second ion implantation process on the first mask layer in a direction forming an acute angle with a top surface of the substrate, and wherein the unremoved portion of the first mask layer is protected from the second ion implantation process by the first spacer.

16. The method of claim 14, wherein the first ion implantation process is performed in a direction perpendicular to a top surface of the substrate.

17. The method of claim 14, further comprising:
after performing the first ion implantation process, removing the third spacer;
forming a high-k dielectric layer over the pocket; and
forming a metal layer over the high-k dielectric layer.

18. The method of claim 14, further comprising, before depositing the first mask layer, forming a second mask layer over the first spacer and the second spacer.

19. The method of claim 14, wherein the third spacer extends along a sidewall of the first spacer.

20. The method of claim 14, wherein an etch selectivity of the altered portion of the first mask layer versus the unremoved portion of the first mask layer is higher than about 3:1.

* * * * *